United States Patent
Ohta et al.

(10) Patent No.: US 8,183,925 B2
(45) Date of Patent: May 22, 2012

(54) HIGH FREQUENCY POWER AMPLIFIER AND OPERATING METHOD THEREOF

(75) Inventors: Ikuma Ohta, Tokyo (JP); Norio Hayashi, Kanagawa (JP); Takayuki Tsutsui, Kanagawa (JP); Fuminori Morisawa, Kanagawa (JP); Masatoshi Hase, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/029,184

(22) Filed: Feb. 17, 2011

(65) Prior Publication Data

US 2011/0210795 A1    Sep. 1, 2011

(30) Foreign Application Priority Data

Feb. 26, 2010  (JP) ................... 2010-041615

(51) Int. Cl.
*H03G 3/10* (2006.01)
(52) U.S. Cl. ........................ 330/285; 330/296
(58) Field of Classification Search .......... 330/285, 330/296
See application file for complete search history.

(56) References Cited

U.S. PATENT DOCUMENTS

| | | | |
|---|---|---|---|
| 6,759,906 B2 * | 7/2004 | Matsunaga et al. | 330/285 |
| 7,123,095 B2 * | 10/2006 | Tsutsui et al. | 330/285 |
| 7,443,245 B2 * | 10/2008 | Tsurumaki et al. | 330/285 |
| 7,501,896 B2 | 3/2009 | Ishikawa et al. | |
| 2004/0108902 A1 * | 6/2004 | Akamine et al. | 330/285 |
| 2005/0083129 A1 | 4/2005 | Tsurumaki et al. | |
| 2007/0008037 A1 * | 1/2007 | Tsutsui et al. | 330/285 |
| 2008/0068086 A1 | 3/2008 | Tsurumaki et al. | |
| 2009/0072906 A1 | 3/2009 | Tsurumaki et al. | |

FOREIGN PATENT DOCUMENTS

| | | |
|---|---|---|
| JP | 2005-20518 A | 1/2005 |
| JP | 2005-123861 A | 5/2005 |
| JP | 2005-150917 A | 6/2005 |

* cited by examiner

*Primary Examiner* — Henry Choe
(74) *Attorney, Agent, or Firm* — Mattingly & Malur, PC

(57) ABSTRACT

A high-frequency power amplifier which can reduce a variation of power gain due to the dependence on gate length of a power amplification field effect transistor is provided. The high-frequency power amplifier comprises, over a semiconductor chip, a bias control circuit, a bias transistor and an amplification transistor which are coupled so as to configure a current mirror circuit, and a gate length monitor circuit comprising a replicating transistor. The amplification transistor amplifies an RF signal and a bias current of the bias control circuit is supplied to the bias transistor. The transistors are fabricated by the same semiconductor manufacturing process, and have the same variation of gate length. The gate length monitor circuit generates a detection voltage depending on the gate length. According to the detection voltage, the bias control circuit controls the bias current, thereby compensating the gate length dependence of transconductance of the amplification transistor.

20 Claims, 5 Drawing Sheets

HIGH FREQUENCY POWER AMPLIFIER AND OPERATING METHOD THEREOF

CLAIM OF PRIORITY

The present application claims priority from Japanese application JP 2010-041615 filed on Feb. 26, 2010, the content of which is hereby incorporated by reference into this application.

FIELD OF THE INVENTION

The present invention relates to a high-frequency power amplifier and an operating method thereof, especially to technology which is effective in reducing variation of power gain due to gate length dependence of transconductance gm of a power amplification field effect transistor provided in the high-frequency power amplifier.

BACKGROUND OF THE INVENTION

From the past, in order to stabilize power amplification characteristics against a power-supply-voltage variation, using a current-mirror-circuit-based bias method, the amount of current increase due to a channel length modulation effect of a source-grounded N-channel MOS transistor, which is biased by a constant current supplied by a constant current source, is detected by a current mirror circuit configured by a P-channel MOS transistor and a current mirror circuit configured by an N-channel MOS transistor (for example, refer to Patent Document 1 cited below).

Also from the past, in order to automatically correct deviation of bias due to a short channel effect of a MOSFET of a high-frequency power amplifier, there is technology which employs a current replicating transistor which has the same channel length and is fabricated by the same process as a power amplification transistor (for example, refer to Patent Document 2 cited below).

Furthermore, from the past, in order to correct deviation of bias due to a short channel effect of an FET of a high-frequency power amplifier, there is technology which provides, to a semiconductor chip of a high-frequency power amplifier, a pad coupled to a gate terminal of a bias transistor on an input side of a current mirror circuit, separately from a pad coupled to a gate terminal of a power amplification transistor on an output side of the current mirror circuit (for example, refer to Patent Document 3 cited below).

Patent Document (Patent Document 1) Japanese Patent Laid-open No. 2005-150917.

(Patent Document 2) Japanese Patent Laid-open No. 2005-123861.

(Patent Document 3) Japanese Patent Laid-open No. 2005-020518.

SUMMARY OF THE INVENTION

In keeping with the recent trend towards downsizing of a mobile-phone terminal, the reduction in size of a high-frequency (i.e., radio-frequency: RF) power amplifier of a transmitter is demanded. In a MOSFET as an example of an amplification element of the RF power amplifier, shortening of the gate length leads to improvement of the high frequency characteristic of the MOSFET; accordingly, it becomes possible to realize the reduction in size of the RF power amplifier through a high level of integration. However, variation of a threshold value and a channel length modulation effect become greater by a short channel effect due to the shortening of the gate length. Consequently, a bias error occurs in the RF power amplifier, and it becomes a cause of variation in the power gain.

Generally, in an RF power amplifier, bias is set to an amplification MOS transistor by a current-mirror-circuit-based bias method. Therefore, when a bias current of an input side of the current mirror circuit is set as a fixed value, even if a threshold value of the MOS transistor of the current mirror circuit changes, it becomes possible to supply a stabilized idle current to the amplification MOS transistor of an output side of the current mirror circuit. However, when a channel length modulation coefficient $\lambda$ is taken into consideration, even if the bias current is set to a fixed value, the idle current of the amplification MOS transistor changes depending on a value of the channel length modulation coefficient $\lambda$; accordingly, it becomes a cause of occurrence of variation of the power gain. That is, gate length of the MOS transistor has an error according to a manufacturing error of a semiconductor integrated circuit in which the amplification MOS transistor is integrated, and as a result, the channel length modulation coefficient $\lambda$ also has variation. Therefore, the bias current of the amplification MOS transistor has variation, resulting in occurrence of variation of the power gain. In the present specification, when bias is set to an amplification MOS transistor by a current-mirror-circuit-based bias method in the state where no high-frequency input signal is supplied to an RF power amplifier, current which flows through a transistor on the input side of the current mirror circuit is called a bias current, and current which flows through an amplification transistor on the output side of the current mirror circuit is called an idle current.

Patent Document 1 cited above discloses technology in which, in order to stabilize power amplification characteristics against a power-supply-voltage variation, with the use of a current-mirror-circuit-based bias method, the amount of current increase due to a channel length modulation effect of a source-grounded N-channel MOS transistor, which is biased by a constant current supplied by a constant current source, is detected by a current mirror circuit configured by a P-channel MOS transistor and a current mirror circuit configured by an N-channel MOS transistor. The detection current is subtracted from another constant current of another constant current source, and the subtracted current is supplied to an input-side MOS transistor which configures the current mirror circuit with an output-side power amplification MOS transistor. The range of variation of current which flows through the power amplification MOS transistor on the output side due to a power-supply-voltage variation can be reduced, through the use of a size ratio and a channel length modulation coefficient $\lambda$ of two N-channel MOS transistors of the current mirror circuit which is configured by the N-channel MOS transistors.

Patent Document 2 cited above discloses technology in which, in order to automatically correct deviation of bias due to a short channel effect of a MOSFET of a high-frequency power amplifier, a current replicating transistor which has the same channel length and is fabricated by the same process as a power amplification transistor is employed. Current which flows through the current replicating transistor is transformed into voltage by a diode-connected N-channel MOS transistor and a current mirror circuit which is configured by a P-channel MOS transistor. A reference bias circuit comprises another current mirror circuit configured by another P-channel MOS transistor, an external resistor coupled between a ground potential and an external terminal of an input side of the another current mirror circuit, and another diode-connected N-channel MOS transistor coupled between an output side of the another current mirror circuit and the ground potential. The voltage of the another diode-connected N-channel MOS transistor of the reference bias circuit and the voltage of a diode-connected N-channel MOS transistor depending on current which flows through the current replicating transistor are compared by a differential amplifier. An output voltage of the differential amplifier is supplied to a gate of the power amplification transistor and to a gate of the current replicating transistor; accordingly, change of an idle current of the power amplification transistor due to a short channel effect is suppressed.

Patent Document 3 cited above discloses technology in which, in order to correct deviation of bias due to a short channel effect of an FET of a high-frequency power amplifier, a pad coupled to a gate terminal of a bias transistor on an input side of a current mirror circuit is provided in a semiconductor chip of a high-frequency power amplifier, separately from a pad coupled to a gate terminal of a power amplification transistor on an output side of the current mirror circuit. A threshold voltage at which current begins to flow through the power amplification transistor on the output side is measured, by changing a bias voltage supplied to a gate of the power amplification transistor in the state where no bias voltage is supplied to a gate of a bias transistor on the input side. Since the channel length modulation coefficient λ cannot be measured directly, the amount of variation DIEL (Drain-Induced Barrier Lowering) of a threshold voltage is measured using the fact that the amount of variation DIBL of the threshold voltage and the channel length modulation coefficient λ have a correlation with each other. Based on the threshold voltage and the amount of variation DIBL which have been measured, an optimal value of resistance of the external resistor for correcting deviation of the bias of the power amplification transistor is calculated. This external resistor is coupled between an external terminal of the semiconductor chip and the ground potential. Between the external terminal and the power supply voltage, a P-channel MOS transistor on the input side of another current mirror circuit is coupled. Between the power supply voltage and the bias transistor on the input side of the current mirror circuit, a P-channel MOS transistor on the output side of the another current mirror circuit is coupled. An external resistor having the optimal value of resistance is chosen in an assembly process of the RF power module.

In advance of the present invention, the present inventors have been engaged in research and development of a highly-integrated small-sized RF power amplifier which has improved a high frequency characteristic through increasingly finer geometries of an LDMOS transistor. Here, "LD" stands for "Laterally Diffused." Therefore, the increasingly finer geometries of the LDMOS transistor have led to a smaller size of the gate length. Consequently, gate length of the MOS transistor has a large error according to a manufacturing error of a semiconductor integrated circuit in which the LDMOS transistor is integrated, and the channel length modulation coefficient λ also has a large manufacturing variation. Therefore, the bias current of the LDMOS transistor has large variation, resulting in occurrence of large variation of the power gain.

Examination performed by the present inventors in advance of the present invention has clarified that the power gain of the RF power amplifier is determined by transconductance gm which is the amplification gain of a MOS transistor and that the transconductance gm itself is dependent on the gate length.

That is, the transconductance gm of a MOS transistor is given by the following equation.

$$gm = \sqrt{2k\frac{W}{L}(1 + \lambda Vds)Ids} \qquad \text{(Equation 1)}$$

In Equation 1, k is a constant which is determined from the structure of the MOS transistor, W is gate width of the MOS transistor, L is gate length of the MOS transistor, λ is a channel modulation coefficient, Vds is a drain-to-source voltage of the MOS transistor, and Ids is an idle current of the MOS transistor.

Therefore, even if the range of variation of current which flows through the power amplification MOS transistor on the output side due to a power-supply-voltage variation is reduced as described in Patent Document 1 cited above, the dependence of the transconductance gm itself on the gate length and the variation of the power gain due to it are not compensated. This is the fact that has been clarified by the examination performed by the present inventors in advance of the present invention.

Even if the change due to the short channel effect of the idle current of the power amplification transistor is suppressed as described in Patent Document 2 cited above, the dependence of the transconductance gm itself on the gate length and the variation of the power gain are not compensated. This is another fact that has been clarified by the examination performed by the present inventors in advance of the present invention.

Furthermore, as described in Patent Document 3 cited above, even if an optimal external resistor for correcting deviation of the bias, calculated on the basis of the threshold voltage and the amount of variation DIBL which have been measured, is employed in order to correct deviation of the bias due to the short channel effect of an FET of the high-frequency power amplifier, the dependence of the transconductance gm itself on the gate length and the variation of the power gain are not compensated. This is yet another fact that has been clarified by the examination performed by the present inventors in advance of the present invention. The method described in Patent Document 3 cited above has problems of the increase of pads in number, the need for measuring the threshold voltage and the amount of variation DIBL, and the need for selecting an external resistor of optimal value of resistance in the assembly process of the RF power module.

The present invention is made as a result of the above-described examination which has been performed by the present inventors in advance of the present invention.

Therefore, the purpose of the present invention is to reduce the variation of the power gain due to gate length dependence of the transconductance gm of the power amplification field effect transistor of the high-frequency power amplifier.

Another purpose of the present invention is to suppress increase of the number of pads and not to necessitate the inspection process and the selection of the external resistor.

The above and other purposes and new features of the present invention will become clear from the description of the present specification and the accompanying drawings.

The following explains briefly typical inventions to be disclosed by the present application.

That is, the typical embodiment of the present invention provides a high-frequency power amplifier (100) which comprises, over a semiconductor chip, a bias field effect transistor (516) and a power amplification field effect transistor (513) which are coupled so as to configure a current mirror, and a bias control circuit (112).

The power amplification field effect transistor (513) amplifies a high-frequency input signal.

A bias current (Ibias3) generated by the bias control circuit (112) is supplied to the bias field effect transistor (516). A gate-to-source voltage of the bias field effect transistor (516) is supplied to between the gate terminal and the source terminal of the power amplification field effect transistor (513).

The high-frequency power amplifier (100) further comprises a gate length monitor circuit (101) comprising an amplifier replicating transistor (421a), over the semiconductor chip.

The amplifier replicating transistor, the bias field effect transistor, and the power amplification field effect transistor are fabricated by the same semiconductor manufacturing process over the semiconductor chip. Accordingly, the amplifier replicating transistor, the bias field effect transistor, and the power amplification field effect transistor exhibit almost same variation of gate length.

The gate length monitor circuit generates a detection voltage (Vmon) indicating the dependence on the gate length (L), detected by the amplifier replicating transistor.

When the gate length (L) exhibits variation, the dependence of transconductance of the power amplification field effect transistor on the gate length (L) is compensated, by the bias control circuit controlling a value of the bias current (Ibias3) according to the detection voltage (refer to FIG. 1, FIG. 2, and FIG. 3).

The following explains briefly an effect obtained by the typical inventions to be disclosed in the present application.

That is, according to the present invention, it is possible to reduce the variation of the power gain due to the gate length dependence of transconductance gm of the power amplification field effect transistor of the high-frequency power amplifier.

DETAILED DESCRIPTION OF THE PREFERRED EMBODIMENTS

1. Summary of the Preferred Embodiments

Figure 1:
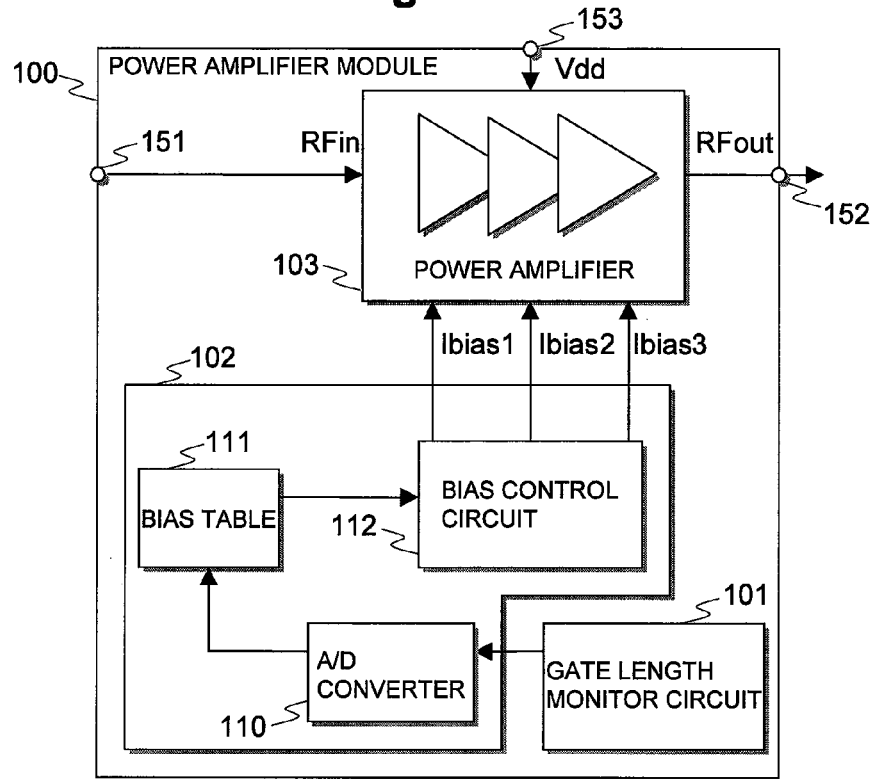
FIG. 1 is a drawing illustrating the configuration of a high-frequency power amplifier according to Embodiment 1 of the present invention, which is mounted in a transmitter of a mobile-phone terminal.

First, summary of a typical embodiment of the invention disclosed in the present application is explained. A numerical symbol of the drawing referred to in parentheses in the outline explanation about the typical embodiment only illustrates what is included in the concept of the component to which the numerical symbol is attached.

(1) A typical embodiment of the present invention provides a high-frequency power amplifier (100) which comprises, over a semiconductor chip, a bias field effect transistor (516) and a power amplification field effect transistor (513) which are coupled so as to configure a current mirror, and a bias control circuit (112).

The power amplification field effect transistor (513) comprises a source terminal coupled to a ground potential, a gate terminal supplied with a high-frequency input signal, and a drain terminal generating a high-frequency amplified output signal.

A bias current (Ibias3) generated by the bias control circuit (112) is supplied to the bias field effect transistor (516). A gate-to-source voltage of the bias field effect transistor (516) is supplied to between the gate terminal and the source terminal of the power amplification field effect transistor (513).

The high-frequency power amplifier (100) further comprises a gate length monitor circuit (101) comprising an amplifier replicating transistor (421a), over the semiconductor chip.

The amplifier replicating transistor, the bias field effect transistor, and the power amplification field effect transistor are fabricated by the same semiconductor manufacturing process over the semiconductor chip. Accordingly, the amplifier replicating transistor, the bias field effect transistor, and the power amplification field effect transistor exhibit almost same variation of gate length.

The gate length monitor circuit generates a detection voltage (Vmon) indicating the dependence on the gate length (L), detected by the amplifier replicating transistor.

The detection voltage generated by the gate length monitor circuit controls the bias control circuit (112). When the gate length (L) exhibits variation, the dependence of transconductance of the power amplification field effect transistor on the gate length (L) is compensated, by the bias control circuit controlling a value of the bias current (Ibias3) according to the detection voltage (refer to FIG. 1, FIG. 2, and FIG. 3).

According to the embodiment, it is possible to reduce the variation of power gain due to the gate length dependence of transconductance gm of a power amplification field effect transistor of a high-frequency power amplifier.

In a preferred embodiment, when the gate length is reduced, increase of the transconductance of the power amplification field effect transistor is compensated by the bias control circuit reducing the value of the bias current according to an increase in the detection voltage (refer to FIG. 1).

In another preferred embodiment, the power amplification field effect transistor comprises plural power amplification field effect transistors (511, 512, 513) configuring a multistage amplifier (103) of the high-frequency power amplifier.

The bias field effect transistor comprises plural bias field effect transistors (514, 515, 516) which are coupled to the power amplification field effect transistors of the multistage amplifier of the high-frequency power amplifier so as to configure respective current mirrors.

The bias current of the bias control circuit comprises plural bias currents (Ibias1, Ibias2, Ibias3) supplied to the plural bias field effect transistors (refer to FIG. 1).

Figure 3:
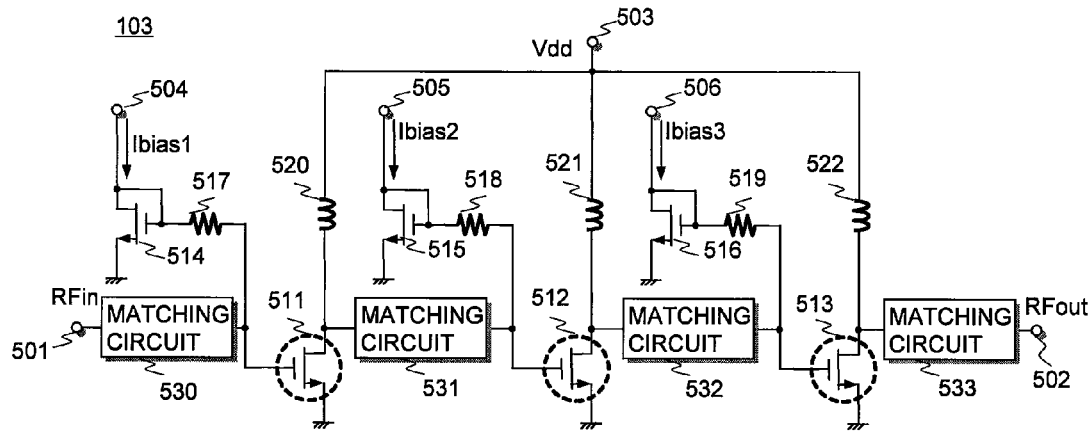
FIG. 3 is a drawing illustrating the configuration of a power amplifier 103 comprised in the high-frequency power amplifier according to Embodiment 1 of the present invention, illustrated in FIG. 1.

In a more preferred embodiment, The multistage amplifier of the high-frequency power amplifier comprises a matching circuit (531, 532, 533) in each interstage (refer to FIG. 3).

Figure 2:
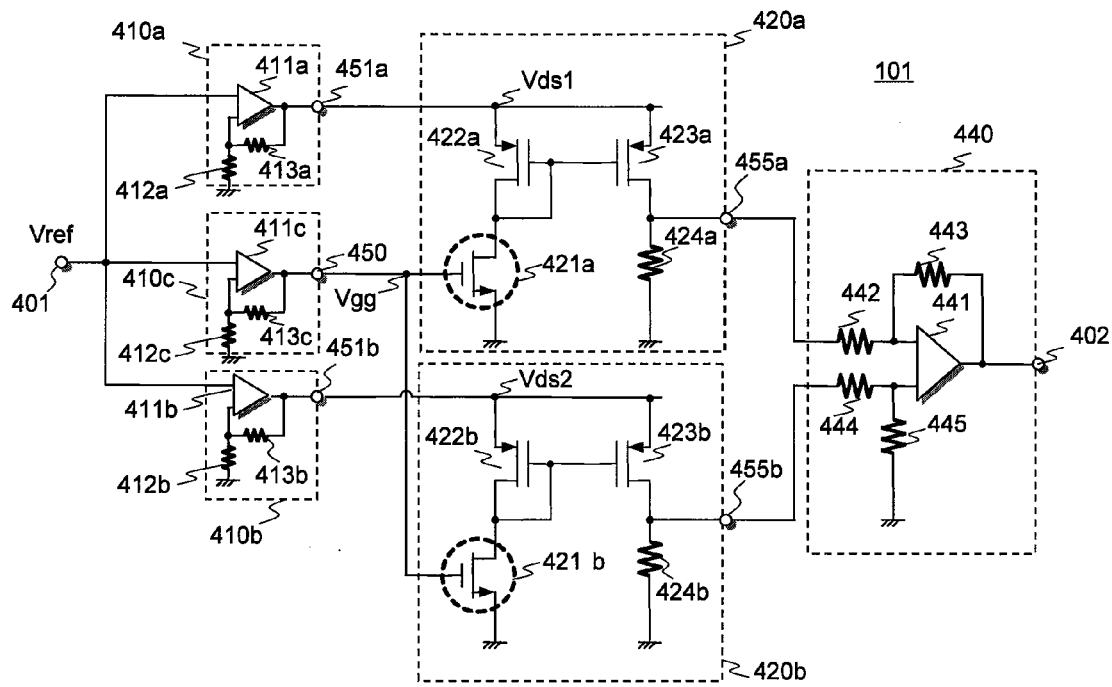
FIG. 2 is a drawing illustrating the configuration of a gate length monitor circuit 101 comprised in the high-frequency power amplifier according to Embodiment 1 of the present invention, illustrated in FIG. 1.
Figure 7:
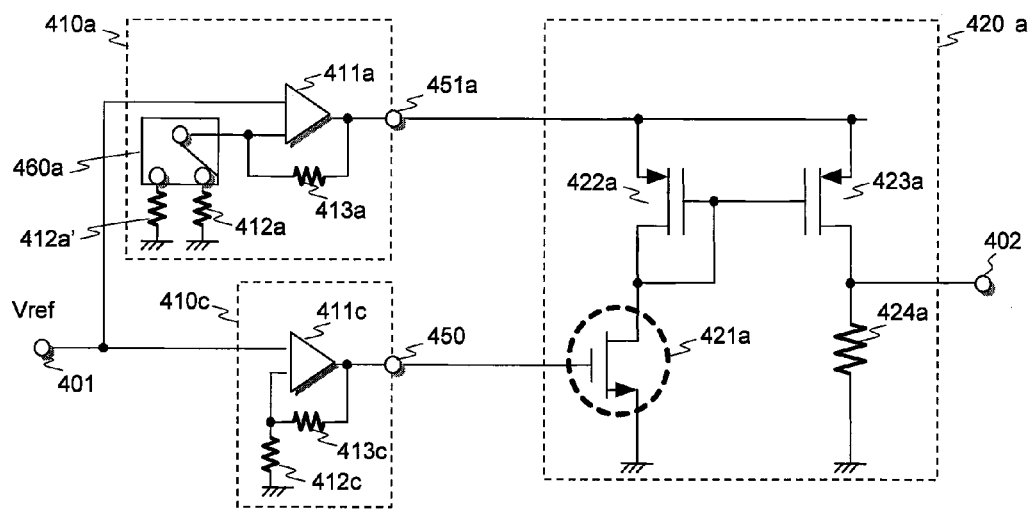
FIG. 7 is a drawing illustrating the configuration of a gate length monitor circuit 101 comprised in the high-frequency power amplifier according to Embodiment 4 of the present invention, illustrated in FIG. 6.

In another more preferred embodiment, the detection voltage generated by the gate length monitor circuit is given by a voltage which is transformed from a difference of different drain currents flowing through the amplifier replicating transistors when drain voltages of different voltage levels are supplied to a drain terminal of the amplifier replicating transistor (refer to FIG. 2 and FIG. 7).

In a specific embodiment, the detection voltage generated by the gate length monitor circuit is supplied to an input terminal of an A/D converter (110), and a converted digital value is generated at an output terminal of the A/D converter.

The converted digital value is supplied to an input terminal of a conversion table (111), and bias digital information is generated at an output terminal of the conversion table.

The bias digital information is supplied to the bias control circuit (112) (refer to FIG. 1).

In a more specific embodiment, the high-frequency power amplifier (100) further comprises the A/D converter and the conversion table (111) over the semiconductor chip (refer to FIG. 1).

In another more specific embodiment, the high-frequency power amplifier (100) further comprises a temperature monitor circuit and a power-supply-voltage monitor circuit over the semiconductor chip.

The temperature monitor circuit generates a chip temperature monitor output signal by monitoring chip temperature of the semiconductor chip.

The power-supply-voltage monitor circuit generates a power-supply-voltage monitor output signal by monitoring a power supply voltage supplied to the multistage amplifier (103).

Figure 5:
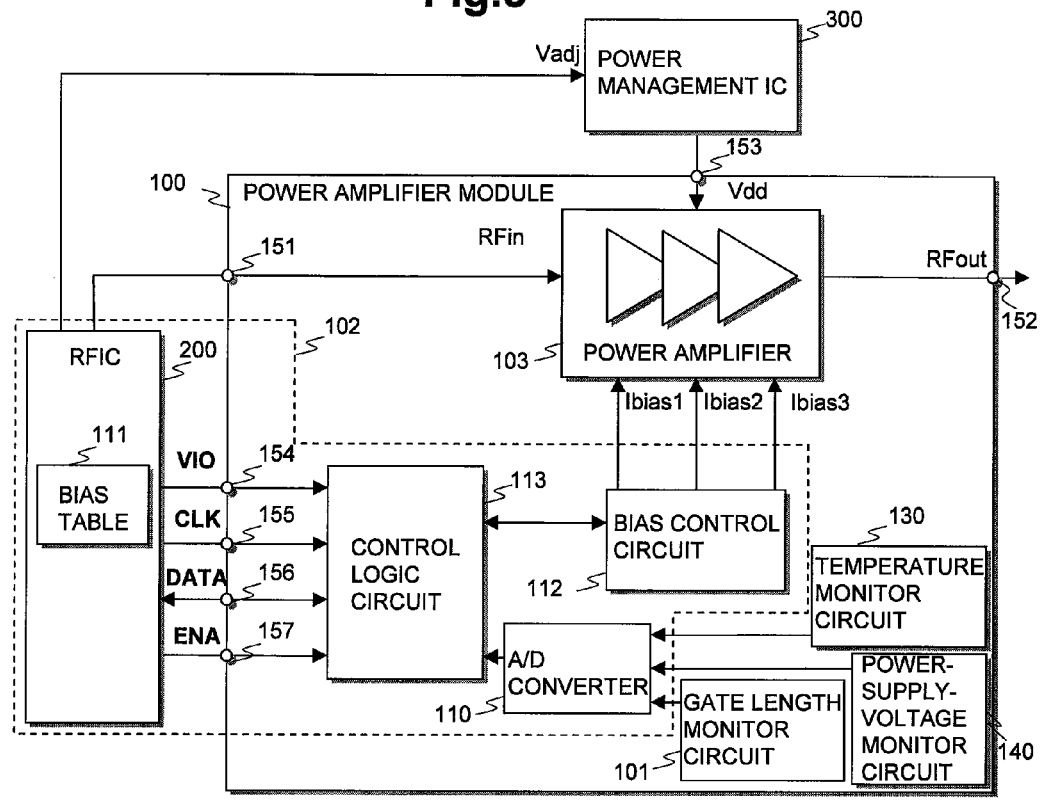
FIG. 5 is a drawing illustrating the configuration of yet another high-frequency power amplifier according to Embodiment 3 of the present invention, which is mounted in a transmitter of a mobile-phone terminal.

The A/D converter converts the detection voltage generated by the gate length monitor circuit, the chip temperature monitor output signal, and the power-supply-voltage monitor output signal into respective digital signals by time sharing (refer to FIG. 5).

In yet another more specific embodiment, the high-frequency power amplifier (100) further comprises the A/D converter and a control logic circuit (113) over the semiconductor chip.

The control logic circuit is coupled by a radio frequency semiconductor integrated circuit (200) external to the semiconductor chip, via a digital interface.

The control logic circuit supplies the converted digital value of the A/D converter to the input terminal of the conversion table (111) built in a semiconductor chip of the radio frequency semiconductor integrated circuit (200) via the digital interface.

Figure 4:
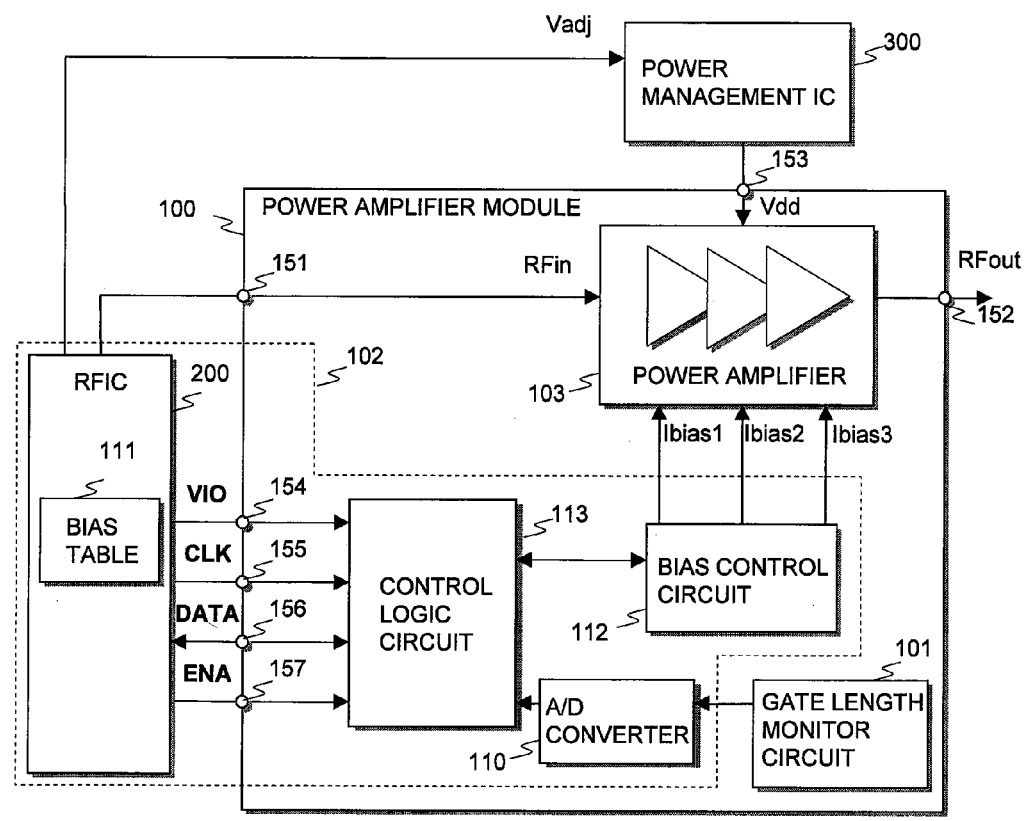
FIG. 4 is a drawing illustrating the configuration of another high-frequency power amplifier according to Embodiment 2 of the present invention, which is mounted in a transmitter of a mobile-phone terminal.

The control logic circuit supplies the bias digital information of the conversion table (111) to the bias control circuit (112) via the digital interface (refer to FIG. 4).

In the most specific embodiment, the high-frequency power amplifier (100) further comprises a control logic circuit (113) over the semiconductor chip.

The control logic circuit is coupled to a radio frequency semiconductor integrated circuit (200) external to the semiconductor chip, via a digital interface.

The A/D converter and the conversion table (111) are built in a semiconductor chip of the radio frequency semiconductor integrated circuit (200).

The detection voltage generated by the gate length monitor circuit is supplied to the input terminal of the A/D converter provided over the semiconductor chip of the radio frequency semiconductor integrated circuit, and the converted digital value is generated at the output terminal of the A/D converter.

The converted digital value is supplied to the input terminal of the conversion table (111), and bias digital information is generated at the output terminal of the conversion table.

Figure 6:
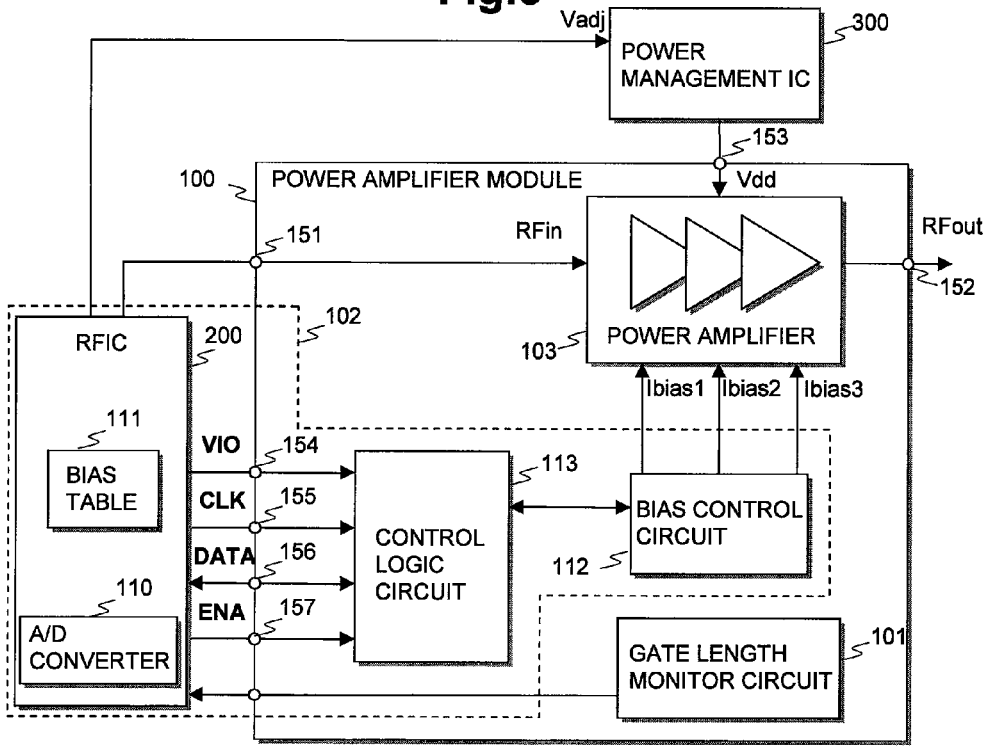
FIG. 6 is a drawing illustrating the configuration of further yet another high-frequency power amplifier according to Embodiment 4 of the present invention, which is mounted in a transmitter of a mobile-phone terminal.

The control logic circuit supplies the bias digital information of the conversion table (111) to the bias control circuit (112) via the digital interface (refer to FIG. 6).

(2) A typical embodiment of another viewpoint of the present invention provides an operating method of a high-frequency power amplifier (100) which comprises, over a semiconductor chip, a bias field effect transistor (516) and a power amplification field effect transistor (513) which are coupled so as to configure a current mirror, and a bias control circuit (112).

The power amplification field effect transistor (513) comprises a source terminal coupled to a ground potential, a gate terminal supplied with a high-frequency input signal, and a drain terminal generating a high-frequency amplified output signal.

A bias current (Ibias3) generated by the bias control circuit (112) is supplied to the bias field effect transistor (516). A gate-to-source voltage of the bias field effect transistor (516) is supplied to between the gate terminal and the source terminal of the power amplification field effect transistor (513).

The high-frequency power amplifier (100) further comprises a gate length monitor circuit (101) comprising an amplifier replicating transistor (421a), over the semiconductor chip.

The amplifier replicating transistor, the bias field effect transistor, and the power amplification field effect transistor are fabricated by the same semiconductor manufacturing process over the semiconductor chip. Accordingly, the amplifier replicating transistor, the bias field effect transistor, and the power amplification field effect transistor exhibit almost same variation in gate length.

The gate length monitor circuit generates a detection voltage (Vmon) indicating the dependence on the gate length (L), detected by the amplifier replicating transistor.

The detection voltage generated by the gate length monitor circuit controls the bias control circuit (112). When the gate length (L) exhibits variation, the dependence of transconductance of the power amplification field effect transistor on the gate length (L) is compensated, by the bias control circuit controlling a value of the bias current (Ibias3) according to the detection voltage (refer to FIG. 1, FIG. 2, and FIG. 3).

According to the embodiment, it is possible to reduce the variation of power gain due to the gate length dependence of transconductance gm of a power amplification field effect transistor of a high-frequency power amplifier.

2. Further Detailed Description of the Preferred Embodiments

Next, the embodiments are explained in full detail. In the entire drawings for explaining the embodiments of the present invention, the same symbol is attached to a component which has the same function, and the repeated explanation thereof is omitted.

(Embodiment 1)

<<Configuration of a High-Frequency Power Amplifier>>

FIG. 1 illustrates the configuration of a high-frequency power amplifier according to Embodiment 1 of the present invention, which is mounted in a transmitter of a mobile-phone terminal.

As illustrated in FIG. 1, the high-frequency power amplifier module 100 comprises fundamentally a power amplifier 103, a gain-variation correction bias supplying circuit 102, and a gate length monitor circuit 101 over a semiconductor chip of a semiconductor integrated circuit. When explained in more detail, the high-frequency power amplifier module 100 comprises an RF signal input terminal 151, an RF signal output terminal 152, a power supply terminal 153, the gate length monitor circuit 101, the gain-variation correction bias supplying circuit 102, the power amplifier 103, an A/D converter 110, a bias table 111, and a bias control circuit 112.

The gate length monitor circuit 101 is a circuit of one output terminal, and the output terminal for a gate length monitored value is coupled to an input terminal of the A/D converter 110.

The A/D converter 110 is a circuit of two terminals with one input and one output. The input terminal is coupled to the output terminal for a gate length monitored value of the gate length monitor circuit 101, and the output terminal is coupled to an input terminal of the bias table 111.

The bias table 111 is a circuit of two terminals with one input and one output. The input terminal is coupled to the output terminal of the A/D converter 110, and the output terminal is coupled to an input terminal of the bias control circuit 112.

The bias control circuit 112 is a circuit of four terminals with one input and three outputs. The input terminal is coupled to the output terminal of the bias table 111, and three bias control output terminals are coupled to three bias control input terminals of the power amplifier 103.

The power amplifier 103 is a circuit of six terminals with five inputs and one output. Three bias control input terminals are coupled to three bias control output terminals of the bias control circuit 112. One input terminal is coupled to the RF signal input terminal 151, the power voltage supply terminal is coupled to the power supply terminal 153, and the output terminal is coupled to the RF signal output terminal 152.

The gain-variation correction bias supplying circuit 102 comprises the A/D converter 110, the bias table 111, and the bias control circuit 112.

<<A Gate Length Monitor Circuit>>

FIG. 2 illustrates the configuration of the gate length monitor circuit 101 comprised in the high-frequency power amplifier according to Embodiment 1 of the present invention, illustrated in FIG. 1.

The gate length monitor circuit 101 illustrated in FIG. 2 comprises a reference voltage terminal 401, step-up circuits 410a, 410b, and 410c, a gate voltage terminal 450, drain voltage terminals 451a and 451b, amplifier-replicating-transistor current detecting circuits 420a and 420b, amplifier-replicating-transistor current monitor voltage terminals 455a and 455b, a voltage difference output circuit 440, and a gate length monitor circuit output terminal 402.

The gate length monitor circuit 101 illustrated in FIG. 2 further comprises differential amplifiers 411a, 411b, 411c, and 441, resistors 412a, 412b, 412c, 413a, 413b, 413c, 424a, 424b, 442, 443, 444, and 445, P-channel MOS transistors 422a, 422b, 423a, and 423b, and N-channel LDMOS transistors 421a and 421b. The gate length of the N-channel LDMOS transistors 421a and 421b is set, for example, as 300 nm which is markedly influenced by gate length variation. On the other hand, the gate length of the P-channel MOS transistors 422a, 422b, 423a, and 423b is set as a sufficiently large value (for example, 2 µm).

The step-up circuits 410a, 410b, and 410c are a circuit of two terminals with one input and one output, and comprise the differential amplifiers 411a, 411b, and 411c, the resistors 412a, 412b, and 412c, and the resistors 413a, 413b, and 413c, respectively. The differential amplifiers 411a, 411b, and 411c are a circuit of three terminals with two inputs and one output, and a noninverting input terminal is coupled to the reference voltage terminal 401, and an inverting input terminal is coupled to respective common coupling nodes of the resistors 412a and 413a, the resistors 412b and 413b, and the resistors 412c and 413c. Output terminals of the differential amplifiers 411a, 411b, and 411c are coupled to the ground potential via series coupling of the resistors 413a and 412a, the resistors 413b and 412b, and the resistors 413c and 412c, respectively. The terminals on an output side of the step-up circuits 410a and 410b are coupled to the drain voltage terminals 451a and 451b, respectively, and the terminal of an output side of the step-up circuit 410c is coupled to the gate voltage terminal 450.

The amplifier-replicating-transistor current detecting circuits 420a and 420b are a circuit of three terminals with two inputs and one output, and comprise the amplifier replicating transistors 421a and 421b, the P-channel MOS transistors 422a and 422b, the P-channel MOS transistor 423a and 423b, and the resistors 424a and 424b, respectively. Gate terminals of the amplifier replicating transistors 421a and 421b are coupled to the gate voltage terminal 450, source terminals are grounded, and drain terminals are coupled to drain terminals and gate terminals of the P-channel MOS transistor 422a and 422b, and to gate terminals of the P-channel MOS transistors 423a and 423b, respectively. The P-channel MOS transistors 422a and 422b and the P-channel MOS transistors 423a and 423b are coupled so as to configure a current mirror, respectively, and the source terminals are coupled to the drain voltage terminals 451a and 451b, respectively. Drain terminals of the P-channel MOS transistor 423a and 423b are coupled to the ground potential via the resistors 424a and 424b, and coupled to the amplifier-replicating-transistor current monitor voltage terminals 455a and 455b, respectively.

The voltage difference output circuit 440 is a circuit of three terminals with two inputs and one output, and comprises the differential amplifier 441 and the resistors 442-445. One end of the resistor 442 is coupled to the amplifier-replicating-transistor current monitor voltage terminal 455a, and the other end of the resistor 442 is coupled to an inverting input terminal of the differential amplifier 441, and also coupled to an output terminal of the differential amplifier 441 via the resistor 443. One end of the resistor 444 is coupled to the amplifier-replicating-transistor current monitor voltage terminal 455b, and the other end of the resistor 444 is coupled to a noninverting input terminal of the differential amplifier 441, and also coupled to the ground potential via the resistor 445. The output terminal of the differential amplifier 441 is coupled to the gate length monitor circuit output terminal 402, and also coupled to the inverting input terminal via the resistor 443.

<<A Power Amplifier>>

FIG. 3 illustrates the configuration of the power amplifier 103 comprised in the high-frequency power amplifier according to Embodiment 1 of the present invention, illustrated in FIG. 1.

The power amplifier 103 illustrated in FIG. 3 comprises an RF input terminal 501, an RF output terminal 502, a power supply voltage terminal 503, bias current terminals 504, 505, and 506, a first stage power amplifier 511, a second stage power amplifier 512, a third stage power amplifier 513, N-channel LDMOS transistors 514, 515, and 516, resistors 517, 518, and 519, choke coil inductors 520, 521, and 522, and matching circuits 530, 531, 532, and 533. The first stage power amplifier 511, the second stage power amplifier 512, and the third stage power amplifier 513 are an LDMOS transistor with a short channel, respectively. The first stage power amplifier 511, the second stage power amplifier 512, the third stage power amplifier 513, and the N-channel LDMOS transistors 514, 515, and 516 are fabricated by the same semiconductor manufacturing process of a semiconductor chip of the semiconductor integrated circuit. It is assumed that the gate length of these transistors is set, for example, as 300 nm which is markedly influenced by gate length variation.

The RF input terminal 501 is coupled to a gate terminal of the first stage amplifier 511 and one end of the resistor 517 via the input matching circuit 530. The other end of the resistor 517 is coupled to a gate terminal and a drain terminal of the N-channel LDMOS transistor 514, and to the bias current terminal 504. A source terminal of the N-channel LDMOS transistor 514 is grounded. That is, the N-channel LDMOS transistor 514 and the first stage amplifier 511 is coupled via the resistor 517 so as to configure a current mirror.

A source terminal of the first stage power amplifier 511 is grounded, and a drain terminal is coupled to the power supply voltage terminal 503 via the choke coil inductor 520, and coupled to a gate terminal of the second stage power amplifier 512 and one end of the resistor 518, via the matching circuit 531 arranged between the first stage and the second stage. The other end of the resistor 518 is coupled to a gate terminal and a drain terminal of the N-channel LDMOS transistor 515 and the bias current terminal 505. A source terminal of the N-channel LDMOS transistor 515 is grounded. That is, the N-channel LDMOS transistor 515 and the second stage power amplifier 512 is coupled via the resistor 518 so as to configure a current mirror.

A source terminal of the second stage power amplifier 512 is grounded, and a drain terminal is coupled to the power supply voltage terminal 503 via the choke coil inductor 521, and coupled to a gate terminal of the third stage power amplifier 513 and one end of the resistor 519 via the matching circuit 532 arranged between the second stage and the third stage. The other end of the resistor 519 is coupled to a gate terminal and a drain terminal of the N-channel LDMOS transistor 516 and the bias current terminal 506. A source terminal of the N-channel LDMOS transistor 516 is grounded. That is, the N-channel LDMOS transistor 516 and the third stage power amplifier 513 is coupled via the resistor 519 so as to configure a current mirror.

A source terminal of the third stage power amplifier 513 is grounded, and a drain terminal is coupled to the power supply voltage terminal 503 via the choke coil inductor 522, and coupled to the RF output terminal 502 via the output matching circuit 533.

<<Operation of the High-Frequency Power Amplifier>>

Next, with reference to FIG. 1 and FIG. 3, operation of the high-frequency power amplifier according to Embodiment 1 of the present invention is explained.

In the high-frequency power amplifier module 100 according to Embodiment 1 of the present invention illustrated in FIG. 1, an RF signal is inputted to the multistage power amplifier 103 via the RF signal input terminal 151 from a signal source (not shown). The input matching circuit 530 has a function for matching output impedance of the signal source (not shown) and input impedance of the first stage power amplifier 511.

In the power amplifier 103 according to Embodiment 1 of the present invention illustrated in FIG. 3, the RF signal inputted to the multistage power amplifier 103 is inputted to the gate terminal of the first stage power amplifier 511 via the input matching circuit 530.

The power supply voltage Vdd is supplied to the drain terminal of the first stage power amplifier 511 from the power supply terminal 503 via the choke coil inductor 520. An idle current of the first stage power amplifier 511 is determined by a bias current Ibias1 for which the gate length variation is corrected by the bias control circuit 112, and the current mirror configuration of the amplification stage. The resistor 517 is set as a value of resistance of 1 kΩ, for example, so that the RF input signal to the gate terminal of the first stage power amplifier 511 may not flow to the N-channel LDMOS transistor 514 of the bias circuit.

The RF signal inputted to the gate terminal of the first stage amplifier 511 is amplified by the first stage amplifier 511, and is outputted from the drain terminal of the first stage amplifier 511. The RF signal outputted from the drain terminal of the first stage amplifier 511 is inputted to the gate terminal of the second stage power amplifier 512 via the matching circuit 531 arranged between the first stage and the second stage. The matching circuit 530 between the first stage and the second stage has a function for matching output impedance of the first stage power amplifier 511 and input impedance of the second stage power amplifier 512.

The power supply voltage Vdd is supplied to the drain terminal of the second stage power amplifier 512 from the power supply terminal 503 via the choke coil inductor 521. An idle current of the second stage power amplifier 512 is determined by a bias current Ibias2 for which the gate length variation is corrected by the bias control circuit 112, and the current mirror configuration of the amplification stage. The resistor 518 is set as a value of resistance of 1 kΩ, for example, so that the RF amplification signal inputted to the gate terminal of the second stage power amplifier 512 may not flow into the N-channel LDMOS transistor 515 of the bias circuit.

The RF signal inputted to the gate terminal of the second stage amplifier 512 is amplified by the second stage amplifier 512, and is outputted from the drain terminal of the second stage amplifier 512. The RF signal outputted from the drain terminal of the second stage amplifier 512 is inputted to the gate terminal of the third stage power amplifier 513 via the matching circuit 532 arranged between the second stage and the third stage. The matching circuit 532 between the second stage and the third stage has a function for matching output impedance of the second stage power amplifier 512 and input impedance of the third stage power amplifier 513.

The power supply voltage Vdd is supplied to the drain terminal of the third stage power amplifier 513 from the power supply terminal 503 via the choke coil inductor 522. An idle current of the third stage power amplifier 513 is determined by a bias current Ibias3 for which the gate length variation is corrected by the bias control circuit 112, and the current mirror configuration of the amplification stage. The resistor 519 is set as a value of resistance of 1 kΩ, for example, so that the RF amplification signal inputted to the gate terminal of the third stage power amplifier 513 may not flow into the N-channel LDMOS transistor 516 of the bias circuit.

The RF signal inputted to the gate terminal of the third stage amplifier 513 is amplified by the third stage amplifier 513, and is outputted from the drain terminal of the third stage amplifier 513. The RF signal outputted from the drain terminal of the third stage amplifier 513 is outputted to the RF output terminal 502 via the output matching circuit 533.

<<Operation of the Gate Length Monitor Circuit>>

Next, with reference to FIG. 2, operation of the gate length monitor circuit according to Embodiment 1 of the present invention is explained.

In the gate length monitor circuit 101 according to Embodiment 1 of the present invention illustrated in FIG. 2, the N-channel LDMOS transistors 421a and 421b which replicate an amplification stage are fabricated by the same semiconductor manufacturing process of a semiconductor integrated circuit as the amplification-stage N-channel LDMOS transistors 511, 512, and 513 in the power amplifier 103. The N-channel LDMOS transistors 421a and 421b which replicate the amplification stage have the same profile of the gate length variation as the amplification-stage N-channel LDMOS transistors 511, 512, and 513 in the power amplifier 103.

The same gate voltage Vgg, stepped up in the step-up circuit 410c based on the reference voltage Vref, is supplied to the gate terminal of the amplification-stage replicating transistors 421a and 422b of the gate length monitor circuit 101, and drain voltages Vds1 and Vds2 which are stepped up in the step-up circuits 410a and 410b are supplied respectively to the drain terminals of the amplification-stage replicating transistors 421a and 422b. In this case, the drain voltages Vds1 and Vds2 are set to have a relation of Vds1>Vds2. Therefore, the drain currents Ids1 and Ids2 of the amplification-stage replicating transistors 421a and 422b are respectively given by the following equations.

$$Ids1 = k\frac{W}{L}(Vgg - Vth)^2(1 + \lambda Vds1) \quad \text{(Equation 2)}$$

$$Ids2 = k\frac{W}{L}(Vgg - Vth)^2(1 + \lambda Vds2) \quad \text{(Equation 3)}$$

where λ is a channel length modulation coefficient of the amplification-stage replicating N-channel MOS transistor, W is gate width of the amplification-stage replicating N-channel MOS transistor, Vth is a threshold voltage of the amplification-stage replicating N-channel MOS transistor, and k is a value which depends on a process parameter of the amplification-stage replicating N-channel MOS transistor.

The drain current Ids1 and the drain current Ids2 are mirrored, respectively, by the current mirror configured by the P-channel MOS transistors 422a and 423a, and by the current mirror configured by the P-channel MOS transistors 422b and 423b. Accordingly, the drain current Ids1 and the drain current Ids2 are converted into voltage signals Vdet1 and Vdet2 by the resistors 424a and 424b. Assuming that a size ratio of the current mirror is 1:1, the voltage signals Vdet1 and Vdet2 are respectively given by the following equations.

$$Vdet1 = R \times Ids1 \quad \text{(Equation 4)}$$

$$Vdet2 = R \times Ids2 \quad \text{(Equation 5)}$$

where, R is a value of resistance of the resistors 424a and 424b.

Since the voltage signals Vdet1 and Vdet2 are inputted to the voltage difference output circuit 440, the voltage difference output circuit 440 outputs a signal voltage Vmon proportional to Vdet1−Vdet2. Accordingly, the signal voltage Vmon is given by the following equation.

$$Vmon = Vdet1 - Vdet2 = \quad \text{(Equation 6)}$$
$$R(Ids1 - Ids2) = Rk\frac{W}{L}(Vgg - Vth)^2(\lambda \times \Delta Vds) \propto \frac{1}{L}\lambda$$

where, ΔVds is a difference of Vds1 and Vds2. From Equation 6, it is understood that the gate length monitor output voltage Vmon has a dependence on the gate length L.

<<A Determining Method of an Idle Current and a Bias Current>>

In the gain-variation correction bias supplying circuit 102 of the high-frequency power amplifier module 100 according to Embodiment 1 of the present invention, illustrated in FIG. 1, a gate length monitor output voltage outputted by the gate length monitor circuit 101 is converted into a digital value by the A/D converter 110, and the converted digital value is inputted to the bias table 111. In response to the digital input value reflecting the gate length, the bias table 111 supplies bias digital output information to the bias control circuit 112. In response to the bias digital output information, the bias control circuit 112 generates the bias currents Ibias1, Ibias2, and Ibias3, which are optimal for keeping almost constant the transconductance of the amplification-stage N-channel LDMOS transistors 511, 512, and 513 of the power amplifier 103. The bias currents Ibias1, Ibias2, and Ibias3 generated by the bias control circuit 112 are supplied to the N-channel LDMOS transistors 514, 515, and 516 of the bias circuit. Accordingly, the value of idle current of the amplification-stage N-channel LDMOS transistors 511, 512, and 513 of the power amplifier 103 is set up by the current-mirror-circuit-based bias method. By the value of the idle current, the transconductance gm of the amplification-stage N-channel LDMOS transistors 511, 512, and 513 of the power amplifier 103 is kept at an almost constant value.

Next, the following explains how to prepare conversion data of the bias digital output information converted from the digital input value reflecting the gate length and stored in the bias table 111.

From Equation 1, it is possible to set a value of the idle current of the amplifying stage transistor so as to control the transconductance gm of the amplification-stage N-channel LDMOS transistors 511, 512, and 513 of the power amplifier 103, to an almost constant value, irrespective of a variation of the gate length L.

Figure 9:
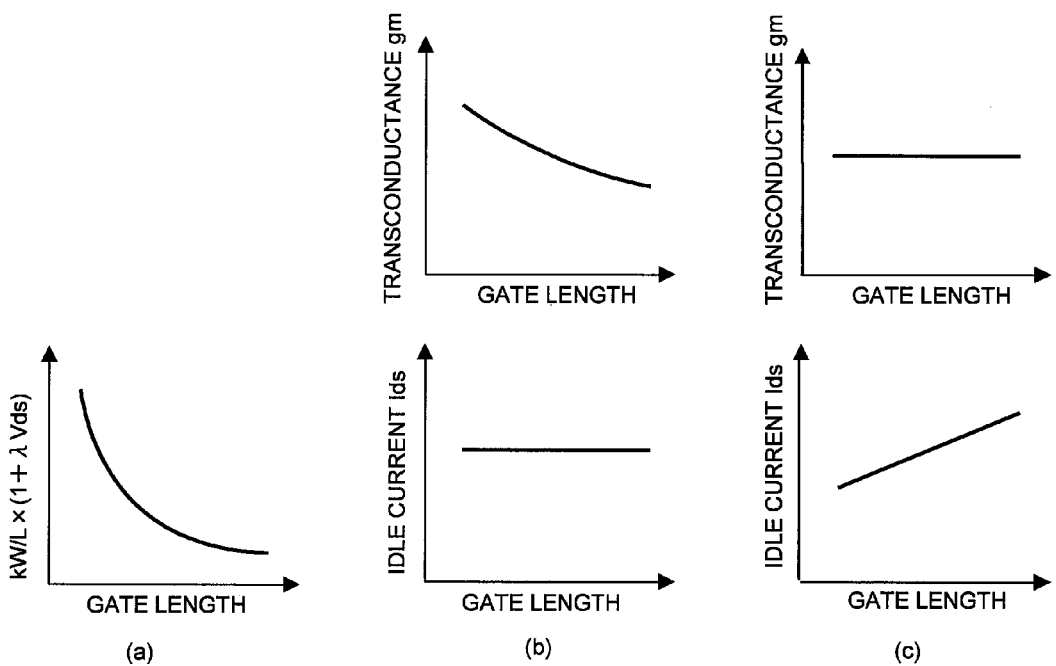
FIG. 9(a), FIG. 9(b), and FIG. 9(c) are drawings illustrating the dependence of the various parameters of an N-channel LDMOS transistor on a variation of gate length L.

FIG. 9(a), FIG. 9(b), and FIG. 9(c) illustrate the dependence of the various parameters of the N-channel LDMOS transistor on a variation of the gate length L.

FIG. 9(a) illustrates dependence on the gate length L of k(W/L)(1+λVds), which is a value of half the square of the transconductance gm of a transistor, given by Equation 1. As illustrated in FIG. 9(a), when the gate length L becomes short, the value of half the square of the transconductance gm increases greatly.

FIG. 9(b) illustrates dependence on the gate length L of the transconductance gm of the amplification-stage N-channel LDMOS transistors 511, 512, and 513 of the power amplifier 103, when the value of the idle current of the amplification-stage N-channel LDMOS transistors 511, 512, and 513 is controlled to an almost constant value against a variation of the gate length L. As illustrated in FIG. 9(b), when the gate length L becomes short, the transconductance gm increases; accordingly, the power gain of the power amplifier 103 increases.

FIG. 9(c) illustrates dependence on the gate length L of the transconductance gm of the amplification-stage N-channel LDMOS transistors 511, 512, and 513 of the power amplifier 103, when the value of the idle current of the amplification-stage N-channel LDMOS transistors 511, 512, and 513 is decreased against the decrease of the gate length L, according to Embodiment 1 of the present invention. As illustrated in FIG. 9(c), even when the gate length L becomes short, the transconductance gm becomes almost constant; accordingly, it is possible to suppress the increase of the power gain of the power amplifier 103.

Correspondence relation of the value of the idle current of the amplification-stage N-channel LDMOS transistors 511, 512, and 513 of the power amplifier 103, and the value of the bias current of the N-channel LDMOS transistors 514, 515, and 516 of the bias circuit is determined approximately by a device ratio of the gate width W of the amplifying stage transistors 511, 512, and 513 and the gate width W of the bias transistors 514, 515, and 516. Furthermore, it is possible to derive the precise correspondence relation by inputting the present device ratio into an electronic circuit simulator.

FIG. 8(a), FIG. 8(b), FIG. 8(c) and FIG. 8(d) illustrate, respectively, dependence on the gate length L of the signal voltage Vmon of the voltage difference output circuit 440 which is a monitor output of the gate length monitor circuit 101; dependence on the gate length L of the bias current Ibias of the bias transistors 514, 515, and 516; and relation between the monitor output signal voltage Vmon and the bias current Ibias, in the high-frequency power amplifier module 100 according to Embodiment 1 of the present invention, explained with reference to FIG. 1, FIG. 2, FIG. 3, and FIG. 9(a), FIG. 9(b), and FIG. 9(c).

Figure 8:
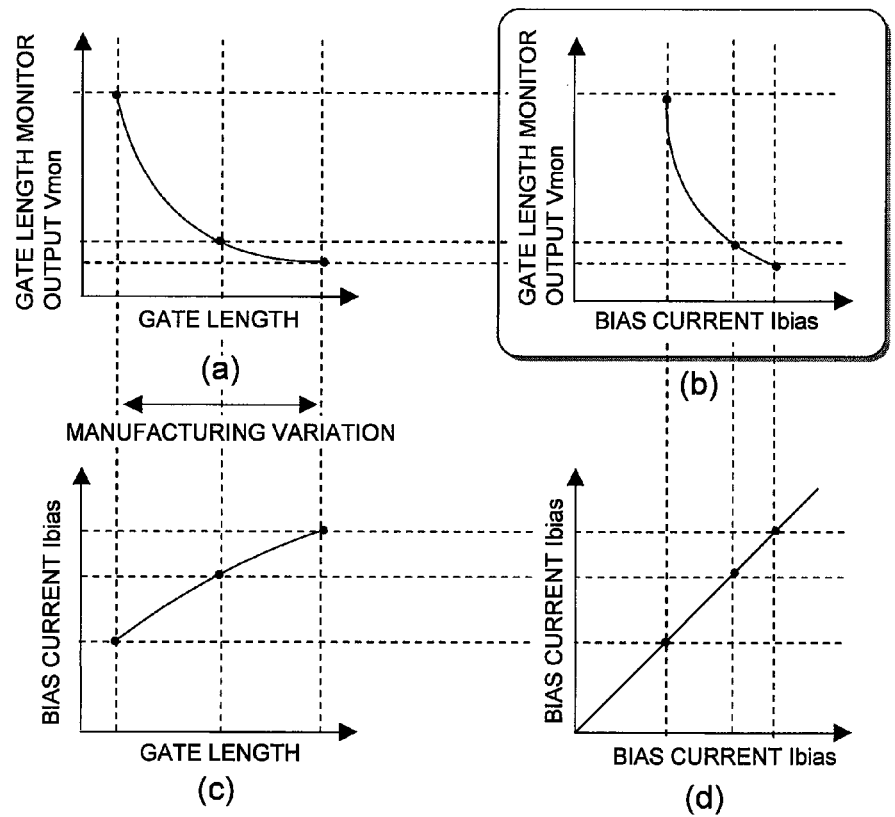
FIG. 8(a), FIG. 8(b), FIG. 8(c) and FIG. 8(d) are drawings illustrating dependence on variation of a gate length L of a signal voltage Vmon of a voltage difference output circuit 440 which is a monitor output of a gate length monitor circuit 101; dependence on variation of a gate length L of a bias current Ibias of bias transistors 514, 515, and 516; and the relation between the monitor output signal voltage Vmon and the bias current Ibias, in a high-frequency power amplifier module 100 according to Embodiment 1 of the present invention, explained with reference to FIG. 1, FIG. 2, FIG. 3, FIG. 9(a), FIG. 9(b), and FIG. 9(c)

From FIG. 8(a), it is understood that the monitor output signal voltage Vmon of the gate length monitor circuit 101 increases as the gate length L decreases.

From FIG. 8(b), it is understood that, when the gate length L decreases, in order to decrease the idle current of the amplification-stage N-channel LDMOS transistors 511, 512, and 513 of the power amplifier 103 according to Embodiment 1 of the present invention, the value of the bias current Ibias of the bias transistors 514, 515, and 516 is decreased by the gain-variation correction bias supplying circuit 102 which has responded to the monitor output signal voltage Vmon of the gate length monitor circuit 101.

That is, as illustrated in FIG. 8(c), in response to the increase of the monitor output signal voltage Vmon of the gate length monitor circuit 101 due to the decrease of the gate length L, the A/D converter 110, the bias table 111, and the bias control circuit 112 of the gain-variation correction bias supplying circuit 102 decrease the current value of the bias current Ibias of the bias transistors 514, 515, and 516.

Figure 10:
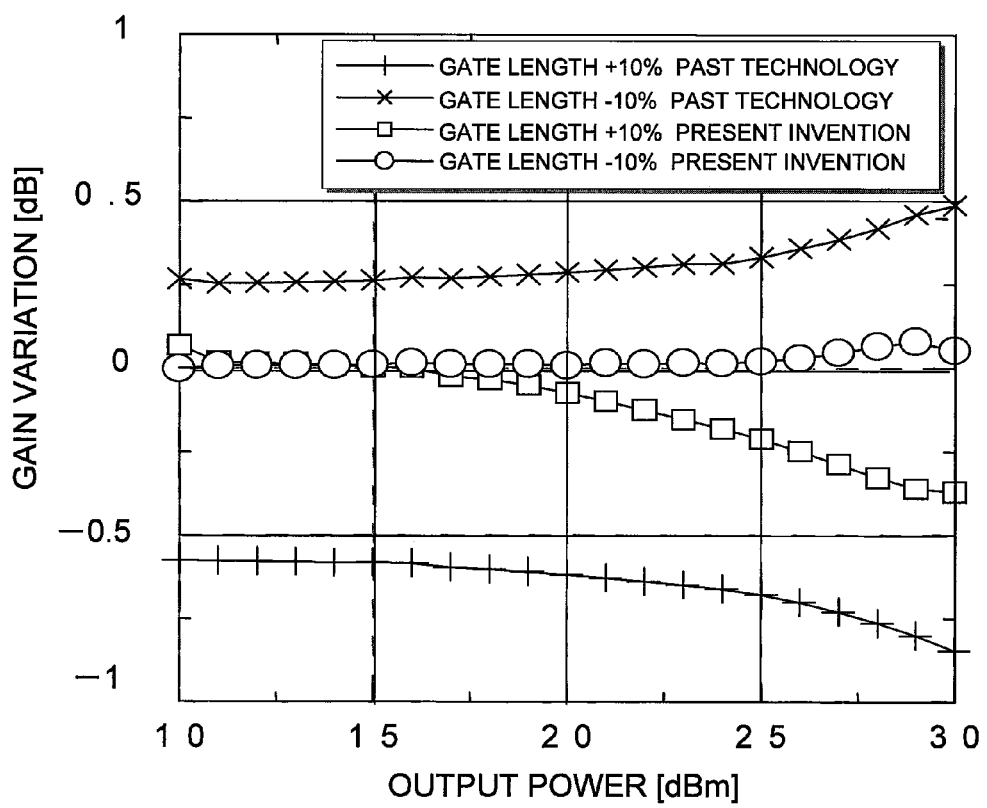
FIG. 10 is a drawing illustrating correction effects of the gain variation to variation of a gate length L, in a high-frequency power amplifier module 100 of Embodiment 1 of the present invention explained with reference to FIG. 1, FIG. 2, FIG. 3, FIG. 8(a), FIG. 8(b), FIG. 8(c), FIG. 8(d), FIG. 9(a), FIG. 9(b), and FIG. 9(c).

FIG. 10 illustrates correction effects of the gain variation to the variation of the gate length L, in the high-frequency power amplifier module 100 according to Embodiment 1 of the present invention, explained with reference to FIG. 1, FIG. 2, FIG. 3, FIG. 8(a), FIG. 8(b), FIG. 8(c), FIG. 8(d), FIG. 9(a), FIG. 9(b), and FIG. 9(c).

The vertical axis of FIG. 10 shows the gain variation of the power amplifier 103, and the horizontal axis of FIG. 10 shows the output power of the power amplifier 103. FIG. 10 assumes a case where the gate length L of the N-channel LDMOS transistor of the power amplifier 103 exhibits the variation of ±10%.

In the past technology as described in Patent Documents 1, 2, and 3 cited above, when the gate length L varies, the bias current and the idle current are controlled to an almost constant value; accordingly, the gain exhibits a large variation due to the dependence of the transconductance gm itself of the MOS transistor on the gate length L.

On the contrary, in the high-frequency power amplifier module 100 according to Embodiment 1 of the present invention, explained with reference to FIG. 1, FIG. 2, FIG. 3, FIG. 8(a), FIG. 8(b), FIG. 8(c), FIG. 8(d), FIG. 9(a), FIG. 9(b), and FIG. 9(c), when the gate length L decreases, the bias current and the idle current are controlled to decrease. Accordingly, the transconductance gm of the MOS transistor becomes almost constant, and increase of the power gain of the power amplifier 103 can be suppressed.

Furthermore, it is understood from FIG. 10 that the gain variation suppression effect is obtained in a wide range from a low-power output of about 10 dBm to a high-power output of about 30 dBm. For example, when compared at an output of 28 dBm, it is understood that the high-frequency power amplifier module 100 according to Embodiment 1 of the present invention can suppress the gain variation of about 50% smaller than the past.

According to the high-frequency power amplifier module 100 according to Embodiment 1 of the present invention, in response to the increase of the monitor output signal voltage Vmon of the gate length monitor circuit 101 due to the decrease of the gate length L, the A/D converter 110, the bias table 111, and the bias control circuit 112 of the gain-variation correction bias supplying circuit 102 decrease on-chip the value of the bias current Ibias of the bias transistors 514, 515, and 516; accordingly, the transconductance gm of the MOS transistor is controlled on-chip to almost constant, and increase of the power gain of the power amplifier 103 is suppressed. Consequently, according to the high-frequency power amplifier module 100 according to Embodiment 1 of the present invention, it is possible to suppress the increase of the number of pads described in a method according to Patent Document 3 cited above, and moreover, it is possible to make it unnecessary to perform the measurement of the threshold voltage and the amount of variation DIBL and to perform the selection of the external resistor of the optimal value of resistance in the assembly process of the RF power module.

(Embodiment 2)

<<Configuration of Another High-Frequency Power Amplifier>>

FIG. 4 illustrates the configuration of another high-frequency power amplifier according to Embodiment 2 of the present invention, which is mounted in a transmitter of a mobile-phone terminal.

A transmitter of a mobile-phone terminal which mounts another high-frequency power amplifier according to Embodiment 2 of the present invention illustrated in FIG. 4 is different in the following point from the transmitter of the mobile-phone terminal which mounts the high-frequency power amplifier according to Embodiment 1 of the present invention illustrated in FIG. 1.

A radio frequency semiconductor integrated circuit (henceforth called RFIC) 200 and a power management IC 300 are added to the transmitter of the mobile-phone terminal according to Embodiment 2 of the present invention, illustrated in FIG. 4.

The RFIC 200 performs DA conversion of a digital transmission baseband signal supplied from a baseband processor (not shown) to an analog transmission baseband signal, and generates an RF transmission signal by further performing orthogonal frequency up-conversion of the analog transmission baseband signal. The RF transmission signal generated by the RFIC 200 is supplied to the RF signal input terminal 151 of the high-frequency power amplifier module 100.

The RFIC 200 performs low-noise amplification of an RF reception signal from a base station received by a mobile-phone terminal's transceiver antenna (not shown) coupled to the RF signal output terminal 152 of the high-frequency power amplifier module 100, and generates an analog reception baseband signal by performing orthogonal frequency down-conversion of the RF amplification signal. The RFIC 200 performs A/D conversion of the analog reception baseband signal to a digital reception baseband signal, and supplies the digital reception baseband signal to a baseband processor (not shown).

The power management IC 300 is supplied with an operating voltage from a battery (not shown) mounted in the mobile-phone terminal. In response to a power-supply-voltage control signal Vadj supplied from the RFIC 200, the power management IC300 controls level of the power supply voltage Vdd of the power amplifier 103. It becomes possible to improve power added efficiency at the time of low-power output, by controlling low a voltage level of the power supply voltage Vdd of the power amplifier 103, especially in a state where a signal amplitude level of the RF transmission output signal is low at the RF signal output terminal 152 of the high-frequency power amplifier module 100.

The bias table 111, which is arranged inside the high-frequency power amplifier module 100 in Embodiment 1 of the present invention illustrated in FIG. 1, is changed to be arranged inside the RFIC 200, in the transmitter of the mobile-phone terminal, in Embodiment 2 of the present invention illustrated in FIG. 4. Following to the present change, a control logic circuit 113 is arranged inside the high-frequency power amplifier module 100, in Embodiment 2 of the present invention illustrated in FIG. 4.

Therefore, in Embodiment 2 of the present invention illustrated in FIG. 4, the control logic circuit 113 of the high-frequency power amplifier module 100 is coupled between the A/D converter 110 of the high-frequency power amplifier module 100 and the bias table 111 of the RFIC 200. Furthermore, the control logic circuit 113 of the high-frequency power amplifier module 100 is coupled between the bias table 111 of the RFIC 200 and the bias control circuit 112 of the high-frequency power amplifier module 100.

The control logic circuit 113 is a circuit of at least six terminals: four terminals comprising a logic voltage terminal (VIO) 154, a clock signal terminal (CLK) 155, a data signal terminal (DATA) 156, and an enable signal terminal (ENA) 157 are coupled to the RFIC 200, one bias control terminal is coupled to the bias control circuit 112, and one digital gate length monitor input terminal is coupled to the A/D converter 110.

Therefore, in Embodiment 2 of the present invention illustrated in FIG. 4, the gain-variation correction bias supplying circuit 102 is configured by the A/D converter 110 inside the high-frequency power amplifier module 100, the bias table 111 inside the RFIC 200, and the control logic circuit 113 and the bias control circuit 112 both inside the high-frequency power amplifier module 100. Consequently, the control logic circuit 113 of the high-frequency power amplifier module 100 functions, with respect to the gain variation correction, as a digital interface which interfaces the A/D converter 110 and the bias control circuit 112 both inside the high-frequency power amplifier module 100 with the bias table 111 inside the RFIC 200.

<<Gain Variation Correction by the Digital Interface>>

The RFIC 200 can write data in an internal memory of the control logic circuit 113 arbitrarily, by supplying to the control logic circuit 113 a clock signal at the clock signal terminal (CLK) 155, a write enable signal at the enable signal terminal (ENA) 157, and a data signal at the data signal terminal (DATA) 156. Furthermore, the RFIC 200 can read stored data of the internal memory of the control logic circuit 113 arbitrarily, by supplying to the control logic circuit 113 a clock signal at the clock signal terminal (CLK) 155, and a read enable signal at the enable signal terminal (ENA) 157.

A gate length monitor output voltage of the output of the gate length monitor circuit 101 is converted into a digital gate length monitor signal by the A/D converter 110, and is stored in the internal memory circuit of the control logic circuit 113.

The RFIC 200 reads the digital gate length monitor signal stored in the internal memory circuit of the control logic circuit 113 from the data signal terminal (DATA) 156, and the read digital gate length monitor signal is supplied to the bias table 111. Then, the bias table 111 outputs bias digital output information having a corresponding characteristic value, from an entry corresponding to the characteristic value of the supplied digital gate length monitor signal. Next, the RFIC 200 stores in the internal memory of the control logic circuit 113 the bias digital output information having the characteristic value outputted from the bias table 111, using the above-mentioned digital interface of the control logic circuit 113 of the high-frequency power amplifier module 100. The bias digital output information having the characteristic value stored in the internal memory of the control logic circuit 113 is supplied to the bias control circuit 112. Then, in response to the bias digital output information having the characteristic value, the bias control circuit 112 generates the bias currents Ibias1, Ibias2, and Ibias3, which are optimal for keeping almost constant the transconductance gm of the amplification-stage N-channel LDMOS transistors 511, 512, and 513 of the power amplifier 103. The bias currents Ibias1, Ibias2, and Ibias3 generated by the bias control circuit 112 are supplied to the N-channel LDMOS transistors 514, 515, and 516 of the bias circuit; accordingly, the value of the idle current of the amplification-stage N-channel LDMOS transistors 511, 512, and 513 of the power amplifier 103 is set up by the current-mirror-circuit-based bias method. With the value of the idle current, the transconductance gm of the amplification-stage N-channel LDMOS transistors 511, 512, and 513 of the power amplifier 103 is kept at an almost constant value.

According to Embodiment 2 of the present invention explained in the above with reference to FIG. 4, it is possible to improve the power added efficiency at the time of low-power output, by controlling low the voltage level of the power supply voltage Vdd of the power amplifier 103 through the operation of the RFIC 200 and the power management IC 300, in a state where the signal amplitude level of the RF transmission output signal is low at the RF signal output terminal 152 of the high-frequency power amplifier module 100.

On the other hand, a variation of a drain-to-source voltage Vds in each of the amplification-stage N-channel LDMOS transistors 511, 512, and 513 of the power amplifier 103 occurs due to dynamic control of the power supply voltage Vdd of the power amplifier 103 by the power management IC 300. Consequently, according to Equation 1, a value of transconductance gm of each of the amplification-stage N-channel LDMOS transistors 511, 512, and 513 of the power amplifier 103 changes due to the variation of the drain-to-source voltage Vds. Therefore, each different bias current and each different idle current are needed for correction of each different transconductance gm and gain variation, in each different voltage value of the power supply voltage Vdd produced by the dynamic control of the power supply voltage Vdd of the power amplifier 103.

Therefore, in a more preferred embodiment of Embodiment 2 of the present invention, plural conversion pages are prepared for the bias table 111 corresponding to plural levels of the power-supply-voltage control signal Vadj supplied to the power management IC 300 from the RFIC 200. That is, in the state of the characteristic power supply voltage Vdd corresponding to the characteristic level of the power-supply-voltage control signal Vadj, a conversion page of the bias table 111 which is optimal for the gain variation correction is chosen by the power-supply-voltage control signal Vadj. It is possible to output the bias digital output information with the optimal value, from the optimal conversion page for the gain variation correction, chosen by the bias table 111.

(Embodiment 3)

FIG. 5 illustrates the configuration of yet another high-frequency power amplifier according to Embodiment 3 of the present invention, which is mounted in a transmitter of a mobile-phone terminal.

The yet another high-frequency power amplifier according to Embodiment 3 of the present invention, mounted in a transmitter of a mobile-phone terminal and illustrated in FIG. 5, is different in the following point from the another high-frequency power amplifier according to Embodiment 2 of the present invention, mounted in the transmitter of the mobile-phone terminal and illustrated in FIG. 4.

In the high-frequency power amplifier module 100 as the yet another high-frequency power amplifier according to Embodiment 3 of the present invention illustrated in FIG. 5, a power-supply-voltage monitor circuit 120 and a temperature monitor circuit 130 are added.

Furthermore, in Embodiment 3 of the present invention illustrated in FIG. 5, the A/D converter 110 of the high-frequency power amplifier module 100 performs time sharing A/D conversion to convert an analog output signal of the gate length monitor circuit 101, an analog output signal of the power-supply-voltage monitor circuit 120, and an analog output signal of the temperature monitor circuit 130 into respective digital signals.

The power-supply-voltage monitor circuit 120 outputs a power-supply-voltage monitor output signal by monitoring the power supply voltage Vdd of the power supply terminal 153. The temperature monitor circuit 130 outputs a chip temperature monitor output signal by monitoring temperature of a semiconductor chip of the semiconductor integrated circuit of the power amplifier 103. Also in the high-frequency power amplifier module 100 according to Embodiment 3 of the present invention illustrated in FIG. 5, a gate length monitor output voltage is outputted from the gate length monitor circuit 101, as is the case with the embodiments described above.

Accordingly, the A/D converter 110 of the gain-variation correction bias supplying circuit 102 perform time sharing A/D conversion to convert the gate length monitor output voltage of the gate length monitor circuit 101, the power-supply-voltage monitor output signal of the power-supply-voltage monitor circuit 120, and the chip temperature monitor output signal of the temperature monitor circuit 130 into respective digital signals. Accordingly, the gate length monitor digital signal, the power-supply-voltage monitor digital signal, and the chip temperature monitor digital signal are sequentially stored in the internal memory circuit of the control logic circuit 113.

The RFIC 200 reads out sequentially, from the data signal terminal (DATA) 156, the gate length monitor digital signal, the power-supply-voltage monitor digital signal, and the chip temperature monitor digital signal which have been stored in the internal memory circuit of the control logic circuit 113. These digital signals read out sequentially are supplied to the bias table 111. Then, an optimal conversion page is chosen from plural conversion pages of the bias table 111 according to the power-supply-voltage monitor digital signal and the chip temperature monitor digital signal. Then, from an entry corresponding to the characteristic value of the supplied gate length monitor digital signal of the optimal conversion page selected, the bias digital output information which has the corresponding characteristic value is outputted.

Next, the RFIC 200 stores in the internal memory of the control logic circuit 113 the bias digital output information having the characteristic value outputted from the bias table 111 using the digital interface of the control logic circuit 113 of the high-frequency power amplifier module 100. The bias digital output information having the characteristic value stored in the internal memory of the control logic circuit 113 is supplied to the bias control circuit 112. Then, in response to the bias digital output information having the characteristic value, the bias control circuit 112 generates the bias currents Ibias1, Ibias2, and Ibias3, which are optimal for keeping almost constant the transconductance gm of the amplification-stage N-channel LDMOS transistors 511, 512, and 513 of the power amplifier 103. The bias currents Ibias1, Ibias2, and Ibias3 generated by the bias control circuit 112 are supplied to the N-channel LDMOS transistors 514, 515, and 516 of the bias circuit, and the value of the idle current of the amplification-stage N-channel LDMOS transistors 511, 512, and 513 of the power amplifier 103 is set up by the current-mirror-circuit-based bias method. With the value of the idle current, the transconductance gm of the amplification-stage N-channel LDMOS transistors 511, 512, and 513 of the power amplifier 103 is kept at an almost constant value.

According to Embodiment 3 of the present invention explained in the above with reference to FIG. 5, the gain-variation correction bias supplying circuit 102 can control optimally the value of the idle current of the amplification-stage N-channel LDMOS transistors 511, 512, and 513 of the power amplifier 103, for the variation of the gate length L, the variation of the power supply voltage Vdd, and the variation of the temperature of the semiconductor chip of the semiconductor integrated circuit. Therefore, it is possible to control the transconductance gm of the transistors 511, 512, and 513 to an almost constant value.

The A/D converter 110 performs time sharing A/D conversion to convert the gate length monitor output voltage of the gate length monitor circuit 101, the power-supply-voltage monitor output signal of the power-supply-voltage monitor circuit 120, and the chip temperature monitor output signal of the temperature monitor circuit 130 into respective digital signals. Accordingly, the A/D converter 110 is shared by the A/D conversion of three analog signals. Consequently, in performing the A/D conversion of plural analog signals, it is possible to avoid increase of the chip occupied area of the A/D converter.

(Embodiment 4)

FIG. 6 illustrates the configuration of further yet another high-frequency power amplifier according to Embodiment 4 of the present invention, which is mounted in a transmitter of a mobile-phone terminal.

The further yet another high-frequency power amplifier according to Embodiment 4 of the present invention, mounted in a transmitter of a mobile-phone terminal and illustrated in FIG. 6, is different in the following point from the another high-frequency power amplifier according to Embodiment 2 of the present invention, mounted in the transmitter of the mobile-phone terminal and illustrated in FIG. 4.

First, in the transmitter of the mobile-phone terminal according to Embodiment 4 of the present invention illustrated in FIG. 6, the A/D converter 110, which is arranged inside the high-frequency power amplifier module 100 according to Embodiment 2 of the present invention, illustrated in FIG. 4, is moved to inside the RFIC 200. Accordingly, the gate length monitor output voltage of the gate length monitor circuit 101 is supplied to an input of the A/D converter 110 inside the RFIC 200 via an external wiring of the high-frequency power amplifier module 100.

Furthermore, a gate length monitor digital signal generated from the output of the A/D converter 110 inside the RFIC 200 is supplied to the bias table 111 via an internal wiring of the RFIC 200. Then, the bias table 111 outputs bias digital output information having a corresponding characteristic value from an entry corresponding to a characteristic value of the supplied digital gate length monitor signal. Next, the RFIC 200 stores in the internal memory of the control logic circuit 113 the bias digital output information having the characteristic value outputted from the bias table 111, using the above-mentioned digital interface of the control logic circuit 113. The bias digital output information having the characteristic value stored in the internal memory of the control logic circuit 113 is supplied to the bias control circuit 112. Then, in response to the bias digital output information having the characteristic value, the bias control circuit 112 generates the bias currents Ibias1, Ibias2, and Ibias3, which are optimal for keeping almost constant the transconductance gm of the amplification-stage N-channel LDMOS transistors 511, 512, and 513 of the power amplifier 103. The bias currents Ibias1, Ibias2, and Ibias3 generated by the bias control circuit 112 are supplied to the N-channel LDMOS transistors 514, 515, and 516 of the bias circuit; accordingly, the value of the idle current of the amplification-stage N-channel LDMOS transistors 511, 512, and 513 of the power amplifier 103 is set up by the current-mirror-circuit-based bias method. With the value of the idle current, the transconductance gm of the amplification-stage N-channel LDMOS transistors 511, 512, and 513 of the power amplifier 103 is kept at an almost constant value.

<<A Gate Length Monitor Circuit>>

FIG. 7 illustrates the configuration of a gate length monitor circuit 101 comprised in the high-frequency power amplifier 100 according to Embodiment 4 of the present invention, illustrated in FIG. 6.

The gate length monitor circuit 101 illustrated in FIG. 7 comprises a reference voltage terminal 401, a step-up circuits 410a and 410c, a gate voltage terminal 450, a drain voltage terminal 451a, an amplifier-replicating-transistor current detecting circuit 420a, and a gate length monitor circuit output terminal 402.

The gate length monitor circuit 101 illustrated in FIG. 7 further comprises differential amplifiers 411a and 411c, resistors 412a, 412a', 412c, 413a, 413c, and 424a, P-channel MOS transistors 422a and 423a, an N-channel LDMOS transistor 421a as an amplification-stage replicating transistor, and a switch 460a. The gate length of the N-channel LDMOS transistor 421a is set, for example, as 300 nm which is markedly influenced by gate length variation. On the other hand, the gate length of the P-channel MOS transistors 422a and 423a is set as a sufficiently large value (for example, 2 μm).

The step-up circuit 410a comprises the differential amplifier 411a, the switch 460a, and the resistors 412a, 412a', and 413a. A noninverting input terminal of the differential amplifier 411a is coupled to the reference voltage terminal 401, and an inverting input terminal is coupled to one end of the resistors 412a and 412a' via the switch 460a, and coupled to one end of the resistor 413. The other ends of the resistors 412a and 412a' are coupled to the ground potential, and the other end of the resistor 413 is coupled to an output terminal and the drain voltage terminal 451a of the differential amplifier 411a.

The step-up circuit 410c comprises the differential amplifier 411c and the resistors 412c and 413c. A noninverting input terminal of the differential amplifier 411c is coupled to the reference voltage terminal 401, and an inverting input terminal is coupled to one end of the resistor 412c and one end of the resistor 413c. The other end of the resistor 412c is coupled to the ground potential. The other end of the resistor 413c is coupled to an output terminal of the differential amplifier 411 and the gate voltage terminal 450.

The amplifier-replicating-transistor current detecting circuit 420a comprises the amplifier replicating transistor 421a, the P-channel MOS transistor 422a, the P-channel MOS transistor 423a, and the resistor 424a. A gate terminal of the amplifier-replicating-transistor current detecting circuit 421a is coupled to the gate voltage terminal 450, a source terminal is coupled to the ground potential, and a drain terminal is coupled to a drain terminal and a gate terminal of the P-channel MOS transistor 422a, and to a gate terminal of the P-channel MOS transistor 423a. Accordingly, the P-channel MOS transistors 422a and 423a are coupled so as to configure a current mirror. Source terminals of the P-channel MOS transistors 422a and 423a are coupled to the drain voltage terminal 451a. A drain terminal of the P-channel MOS transistor 423a is grounded via the resistor 424a, and coupled to the gate length monitor circuit output terminal 402.

In the gate length monitor circuit 101 according to Embodiment 4 of the present invention illustrated in FIG. 7, the amplification-stage-replicating N-channel LDMOS transistor 421a is fabricated by the same semiconductor manufacturing process of a semiconductor integrated circuit as the amplification-stage N-channel LDMOS transistors 511, 512, and 513 of the power amplifier 103. The amplification-stage-replicating N-channel LDMOS transistor 421a has the same variation profile of a gate length as the amplification-stage N-channel LDMOS transistors 511, 512, and 513 of the power amplifier 103.

The gate terminal of the amplification-stage replicating transistor 421a is supplied with a gate voltage Vgg stepped up by the step-up circuit 410c based on the reference voltage Vref. The switch 460a is coupled to the resistor 412a at first, and to the resistor 412a' at the next timing. In response to the switching operation of the switch 460a, the voltage at the output voltage terminal 451a of the step-up circuit 410a is switched according to the difference in value of resistance of the resistors 412a and 412a'. The drain terminal of the amplification-stage replicating transistor 421a is supplied with a first drain voltage Vds1 and a second drain voltage Vds2, sequentially and alternately. Accordingly, the first voltage signal Vdet1 given by Equation 4 and the second voltage signal Vdet2 given by Equation 5 are outputted to the gate length monitor circuit output terminal 402, sequentially and alternately.

Accordingly, the first voltage signal and the second voltage signal which are outputted to the gate length monitor circuit output terminal 402 of the gate length monitor circuit 101 illustrated in FIG. 7 are supplied, sequentially and alternately, as the gate length monitor output voltage, to the input of the A/D converter 110 inside the RFIC 200 via an external wiring of the high-frequency power amplifier module 100. The RFIC 200 comprises a digital arithmetic circuit (not shown) in its interior. The digital arithmetic circuit performs subtraction of the second digital conversion value of the second voltage signal Vdet2 from the first digital conversion value of the first voltage signal Vdet1 which are outputted by the A/D converter 110. It is understood that the subtraction result obtained by the digital arithmetic circuit has the same dependence on the gate length L as the gate length monitor output voltage Vmon given by Equation 6.

In the gain-variation correction bias supplying circuit 102 of the high-frequency power amplifier module 100 according to Embodiment 4 of the present invention illustrated in FIG. 6, the subtraction result obtained by the digital arithmetic circuit is inputted into the bias table 111. In response to the digital input value reflecting the gate length, the bias table 111 supplies bias digital output information to the bias control circuit 112. In response to the bias digital output information, the bias control circuit 112 generates the bias currents Ibias1, Ibias2, and Ibias3, which are optimal for keeping almost constant the transconductance gm of the amplification-stage N-channel LDMOS transistors 511, 512, and 513 of the power amplifier 103. The bias currents Ibias1, Ibias2, and Ibias3 generated by the bias control circuit 112 are supplied to the N-channel LDMOS transistors 514, 515, and 516 of the bias circuit; accordingly, the value of the idle current of the amplification-stage N-channel LDMOS transistors 511, 512, and 513 of the power amplifier 103 is set up by the current-mirror-circuit-based bias method. With the value of the idle current, the transconductance gm of the amplification-stage N-channel LDMOS transistors 511, 512, and 513 of the power amplifier 103 is kept at an almost constant value.

As described above, the invention accomplished by the present inventors has been concretely explained based on various embodiments. However, it cannot be overemphasized that the present invention is not restricted to the embodiments, and it can be changed variously in the range which does not deviate from the gist.

For example, the amplification transistor and the amplification-stage replicating transistor of the power amplifier 103 are not limited to the N-channel LDMOS transistor. It is also preferable to use instead an HEMT transistor or an MESFET which can be integrated to a semiconductor chip of compound semiconductor integrated circuits, such as GaAs, other than a Silicon semiconductor.

Furthermore, the high-frequency power amplifier according to the present invention is not limited to the high-frequency power amplifier which can be mounted in a transmitter of a mobile-phone terminal, but it can be rightfully employed for a high-frequency power amplifier which can be mounted in a wireless LAN communication terminal.

What is claimed is:

1. A radio-frequency power amplifier comprising:
a bias field effect transistor;
a power amplification field effect transistor;
a bias control circuit; and
a gate length monitor circuit comprising an amplifier replicating transistor,
wherein the bias field effect transistor and the power amplification field effect transistor are coupled so as to configure a current mirror,
wherein the bias field effect transistor, the power amplification field effect transistor, the bias control circuit, and the gate length monitor circuit are provided on a semiconductor chip,
wherein the power amplification field effect transistor comprises a source terminal coupled to a ground potential, a gate terminal supplied with a radio-frequency input signal, and a drain terminal generating a radio-frequency amplified output signal,
wherein the bias field effect transistor is supplied with a bias current generated by the bias control circuit, and a gate-to-source voltage of the bias field effect transistor is supplied to between the gate terminal and the source terminal of the power amplification field-effect transistor,
wherein the amplifier replicating transistor, the bias field effect transistor, and the power amplification field effect transistor are designed to exhibit almost same variation in gate length, by fabricating the amplifier replicating transistor, the bias field effect transistor, and the power amplification field-effect transistor on the semiconductor chip by the same semiconductor manufacturing process,
wherein the gate length monitor circuit generates a detection voltage indicative of the gate length dependence detected by the amplifier replicating transistor,
wherein the bias control circuit is controlled by the detection voltage generated by the gate length monitor circuit, and
wherein, when the gate length exhibits variation, the dependence of transconductance of the power amplification field effect transistor on the gate length is compensated, by the bias control circuit controlling a value of the bias current according to the detection voltage.

2. The radio-frequency power amplifier according to claim 1,
wherein, when the gate length is reduced, increase of the transconductance of the power amplification field-effect transistor is compensated by the bias control circuit reducing the value of the bias current according to an increase in the detection voltage.

3. The radio-frequency power amplifier according to claim 2,
wherein the power amplification field effect transistor comprises a plurality of power amplification field effect transistors configuring a multistage amplifier of the radio-frequency power amplifier,
wherein the bias field effect transistor comprises a plurality of bias field effect transistors which are coupled to the power amplification field effect transistors of the multistage amplifier of the radio-frequency power amplifier so as to configure respective current mirrors, and
wherein the bias current of the bias control circuit comprises a plurality of bias currents supplied to the bias field effect transistors.

4. The radio-frequency power amplifier according to claim 3,
wherein the multistage amplifier of the radio-frequency power amplifier comprises a matching circuit in each interstage.

5. The radio-frequency power amplifier according to claim 4,
wherein the detection voltage generated by the gate length monitor circuit is given by a voltage transformed from a difference of different drain currents which flow through the amplifier replicating transistors when drain voltages of different voltage levels are supplied to drain terminals of the amplifier replicating transistors.

6. The radio-frequency power amplifier according to claim 5,
wherein the detection voltage generated by the gate length monitor circuit is supplied to an input terminal of an A/D converter and a converted digital value is generated at an output terminal of the A/D converter, wherein the converted digital value is supplied to an input terminal of a conversion table and bias digital information is generated at an output terminal of the conversion table, and wherein the bias digital information is supplied to the bias control circuit.

7. The radio-frequency power amplifier according to claim 6, wherein the A/D converter and the conversion table are provided on the semiconductor chip.

8. The radio-frequency power amplifier according to claim 6, further comprising:

a temperature monitor circuit provided on the semiconductor chip; and a power-supply-voltage monitor circuit provided on the semiconductor chip, wherein the temperature monitor circuit generates a chip temperature monitor output signal by monitoring chip temperature of the semiconductor chip, wherein the power-supply-voltage monitor circuit generates a power-supply-voltage monitor output signal by monitoring a power supply voltage supplied to the multistage amplifier, and wherein the A/D converter converts the detection voltage generated by the gate length monitor circuit, the chip temperature monitor output signal, and the power-supply-voltage monitor output signal into respective digital signals by time sharing.

9. The radio-frequency power amplifier according to claim 6, further comprising:

a control logic circuit provided on the semiconductor chip along with the A/D converter, wherein the control logic circuit is coupled to a radio frequency semiconductor integrated circuit external to the semiconductor chip, via a digital interface, wherein the control logic circuit supplies the converted digital value of the A/D converter to the input terminal of the conversion table built in a semiconductor chip of the radio frequency semiconductor integrated circuit, via the digital interface, and wherein the control logic circuit supplies the bias digital information of the conversion table to the bias control circuit via the digital interface.

10. The radio-frequency power amplifier according to claim 9, further comprising:

a temperature monitor circuit provided on the semiconductor chip; and a power-supply-voltage monitor circuit provided on the semiconductor chip, wherein the temperature monitor circuit generates a chip temperature monitor output signal by monitoring chip temperature of the semiconductor chip, wherein the power-supply-voltage monitor circuit generates a power-supply-voltage monitor output signal by monitoring a power supply voltage supplied to the multistage amplifier, and wherein the A/D converter converts the detection voltage generated by the gate length monitor circuit, the chip temperature monitor output signal, and the power-supply-voltage monitor output signal into respective digital signals by time sharing.

11. The radio-frequency power amplifier according to claim 6, further comprising:

a control logic circuit provided on the semiconductor chip, wherein the control logic circuit is coupled to a radio frequency semiconductor integrated circuit external to the semiconductor chip, via a digital interface, wherein the A/D converter and the conversion table are built in a semiconductor chip of the radio frequency semiconductor integrated circuit, wherein the detection voltage generated by the gate length monitor circuit is supplied to the input terminal of the A/D converter provided on the semiconductor chip of the radio frequency semiconductor integrated circuit, and the converted digital value is generated at the output terminal of the A/D converter, wherein the converted digital value is supplied to the input terminal of the conversion table, and bias digital information is generated at the output terminal of the conversion table, and wherein the control logic circuit supplies the bias digital information of the conversion table to the bias control circuit via the digital interface.

12. An operating method of a radio-frequency power amplifier comprising on a semiconductor chip: a bias field effect transistor; a power amplification field effect transistor coupled to the bias field effect transistor so as to configure a current mirror; a bias control circuit; and a gate length monitor circuit, the operating method comprising the steps of:

generating a detection voltage by using the gate length monitor circuit to control the bias control circuit; and compensating a gate length dependence such a dependence as of transconductance of the power amplification field effect transistor upon a gate length, by the bias control circuit controlling a value of a bias current in accordance with the detection voltage, in case that the gate length exhibits variation, wherein the power amplification field effect transistor comprises a source terminal coupled to a ground potential, a gate terminal supplied with a radio-frequency input signal, and a drain terminal generating a radio-frequency amplified output signal, wherein the bias field effect transistor is supplied with the bias current generated by the bias control circuit, and a gate-to-source voltage of the bias field effect transistor is supplied to between the gate terminal and the source terminal of the power amplification field-effect transistor, wherein the gate length monitor circuit comprises an amplifier replicating transistor provided on the semiconductor chip, wherein the amplifier replicating transistor, the bias field effect transistor, and the power amplification field effect transistor are designed to exhibit almost same variation in gate length, by fabricating the amplifier replicating transistor, the bias field effect transistor, and the power amplification field-effect transistor on the semiconductor chip by the same semiconductor manufacturing process, and wherein the gate length monitor circuit generates the detection voltage indicative of the gate length dependence detected by the amplifier replicating transistor.

13. The operating method of the radio-frequency power amplifier according to claim 12, wherein, when the gate length is reduced, increase of the transconductance of the power amplification field-effect transistor is compensated by the bias control circuit reducing the value of the bias current according to an increase in the detection voltage.

14. The operating method of the radio-frequency power amplifier according to claim 13, wherein the power amplification field effect transistor comprises a plurality of power amplification field effect transistors configuring a multistage amplifier of the radio-frequency power amplifier, wherein the bias field effect transistor comprises a plurality of bias field effect transistors which are coupled to the power amplification field effect transistors of the multistage amplifier of the radio-frequency power amplifier so as to configure respective current mirrors, and wherein the bias current of the bias control circuit comprises a plurality of bias currents supplied to the bias field effect transistors.

15. The operating method of the radio-frequency power amplifier according to claim 14, wherein the multistage amplifier of the radio-frequency power amplifier comprises a matching circuit in each interstage.

16. The operating method of the radio-frequency power amplifier according to claim 15, wherein the detection voltage generated by the gate length monitor circuit is given by a voltage transformed from a difference of different drain currents which flow through the amplifier replicating transistors when drain voltages of different voltage levels are supplied to drain terminals of the amplifier replicating transistors.

17. The operating method of the radio-frequency power amplifier according to claim 16, wherein the detection voltage generated by the gate length monitor circuit is supplied to an input terminal of an A/D converter and a converted digital value is generated at an output terminal of the A/D converter, wherein the converted digital value is supplied to an input terminal of a conversion table and bias digital information is generated at an output terminal of the conversion table, and wherein the bias digital information is supplied to the bias control circuit.

18. The operating method of the radio-frequency power amplifier according to claim 17, wherein the A/D converter and the conversion table are provided on the semiconductor chip.

19. The operating method of the radio-frequency power amplifier according to claim 17, wherein the radio-frequency power amplifier further comprises a control logic circuit provided on the semiconductor chip along with the A/D converter, wherein the control logic circuit is coupled to a radio frequency semiconductor integrated circuit external to the semiconductor chip, via a digital interface, wherein the control logic circuit supplies the converted digital value of the A/D converter to the input terminal of the conversion table built in a semiconductor chip of the radio frequency semiconductor integrated circuit, via the digital interface, and wherein the control logic circuit supplies the bias digital information of the conversion table to the bias control circuit via the digital interface.

20. The operating method of the radio-frequency power amplifier according to claim 17, wherein the radio-frequency power amplifier further comprises a control logic circuit provided on the semiconductor chip, wherein the control logic circuit is coupled to a radio frequency semiconductor integrated circuit external to the semiconductor chip, via a digital interface, wherein the A/D converter and the conversion table are built in a semiconductor chip of the radio frequency semiconductor integrated circuit, wherein the detection voltage generated by the gate length monitor circuit is supplied to the input terminal of the A/D converter provided on the semiconductor chip of the radio frequency semiconductor integrated circuit, and the converted digital value is generated at the output terminal of the A/D converter, wherein the converted digital value is supplied to the input terminal of the conversion table, and bias digital information is generated at the output terminal of the conversion table, and wherein the control logic circuit supplies the bias digital information of the conversion table to the bias control circuit via the digital interface.

* * * * *